(12) United States Patent
Zhong et al.

(10) Patent No.: US 8,312,343 B2
(45) Date of Patent: Nov. 13, 2012

(54) SYSTEMS AND METHODS FOR RE-USING DECODING PARITY IN A DETECTOR CIRCUIT

(75) Inventors: Hao Zhong, Milpitas, CA (US); Weijun Tan, Longmont, CO (US); Yang Han, Santa Clara, CA (US); Zongwang Li, San Jose, CA (US); Shaohua Yang, Santa Clara, CA (US); Yuan Xing Lee, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 663 days.

(21) Appl. No.: 12/510,859

(22) Filed: Jul. 28, 2009

(65) Prior Publication Data
US 2011/0029826 A1 Feb. 3, 2011

(51) Int. Cl.
*H03M 13/00* (2006.01)
(52) U.S. Cl. .................. 714/752; 714/758
(58) Field of Classification Search .............. 714/752, 714/758
See application file for complete search history.

(56) References Cited

U.S. PATENT DOCUMENTS

| | | |
|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,097,764 A | 8/2000 | McCallister et al. |
| 6,216,251 B1 | 4/2001 | McGinn |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |
| 6,671,404 B1 | 12/2003 | Kawatani et al. |
| 6,748,034 B2 | 6/2004 | Hattori et al. |
| 6,757,862 B1 | 6/2004 | Marianetti |

(Continued)

FOREIGN PATENT DOCUMENTS

WO WO 2006/016751 2/2006

(Continued)

OTHER PUBLICATIONS

Zhong et al., "Iterative MAX-LOG-MAP and LDPC Detector/Decoder Hardware Implementation for Magnetic Read Channel", SRC Techron, pp. 1-4, Oct. 2005.

(Continued)

*Primary Examiner* — Sam Rizk
(74) *Attorney, Agent, or Firm* — Hamilton, DeSanctis & Cha (57) ABSTRACT

Various approaches related to systems and methods for reusing decoding parity.

20 Claims, 5 Drawing Sheets

U.S. PATENT DOCUMENTS

| | | | |
|---|---|---|---|
| 6,788,654 | B1 | 9/2004 | Hashimoto et al. |
| 6,810,502 | B2 | 10/2004 | Eidson |
| 6,986,098 | B2 | 1/2006 | Poeppelman |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,072,417 | B1 * | 7/2006 | Burd et al. .............. 375/295 |
| 7,093,179 | B2 | 8/2006 | Shea |
| 7,184,486 | B1 * | 2/2007 | Wu et al. ................ 375/262 |
| 7,191,378 | B2 | 3/2007 | Eroz et al. |
| 7,203,887 | B2 | 4/2007 | Eroz et al. |
| 7,257,764 | B2 | 8/2007 | Suzuki et al. |
| 7,310,768 | B2 | 12/2007 | Eidson et al. |
| 2004/0098659 | A1 | 5/2004 | Bjerke et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0248435 | A1 | 11/2006 | Haratsch |
| 2007/0011569 | A1 | 1/2007 | Casado et al. |
| 2007/0047635 | A1 | 3/2007 | Stojanovic et al. |
| 2007/0286270 | A1 | 12/2007 | Huang et al. |
| 2008/0049825 | A1 | 2/2008 | Chen et al. |
| 2008/0168330 | A1 | 7/2008 | Graef et al. |

FOREIGN PATENT DOCUMENTS

| | | |
|---|---|---|
| WO | WO 2006/091797 | 8/2007 |

OTHER PUBLICATIONS

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v.43, pp. 1118-1123, Mar. 20.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. on Circuits, Regular Papers, vol. 5, No. 4, pp. 766-775, Apr. 2005.

Casado et al., Multiple-rate low-density parity-check codes with constant blocklength, IEEE Transations on Communications, Jan. 2009, vol. 57, pp. 75-83.

Collins and Hizlan, "Determinate State Convolutional Codes", IEEE Transactions on Communications, Dec. 1993.

Han and Ryan, "Pinning Techniques for Low-Floor Detection/Decoding of LDPC-Coded Parial Response Channels"; 5th Intnl. Symposium on Turbo Codes and Related Topics, 2008.

Eleftheriou, E. et al., "Low Density Parity Check Codes for Digital Subscriber Lines", Proc ICC 2002, pp. 1752-1757.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

* cited by examiner

SYSTEMS AND METHODS FOR RE-USING DECODING PARITY IN A DETECTOR CIRCUIT

BACKGROUND OF THE INVENTION

The present inventions are related to systems and methods for data processing, and more specifically to systems and methods for detecting and/or decoding data sets.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. It often requires two or more data detection/decoding processes before efforts to recover the retrieved data succeeds. In some cases, convergence on a desired output is not even possible. Each data detection/decoding process consumes considerable power which reduces the operational effectiveness of the process.

Hence, there exists a need in the art for advanced systems and methods for data recovery in data processing systems.

BRIEF SUMMARY OF THE INVENTION

The present inventions are related to systems and methods for data processing, and more specifically to systems and methods for detecting and/or decoding data sets.

Various embodiments of the present invention provide data processing systems that include a data detection circuit, an ungrouping circuit, and a decoding circuit. The data detection circuit includes pruning one or more trellis data paths based upon satisfaction of a parity equation including active bits grouped from an LDPC codeword, and the active bits include at least one LDPC parity bit. The ungrouping circuit is operable to re-create the LDPC codeword, and the decoding circuit performs an LDPC decoding algorithm on the LDPC codeword. In some instances of the aforementioned embodiments, the data detection circuit performs a Viterbi algorithm data detection. In various instances of the aforementioned embodiments, the LDPC codeword is a transferred LDPC codeword. In such instances, the systems further include a grouping circuit that receives a pre-transfer LDPC codeword. The grouping circuit assembles the active bits corresponding to a parity check equation of the pre-transferred LDPC codeword to yield a grouped data set. In some cases, the system further includes a transmission circuit that transmits the grouped data set.

Yet other embodiments of the present invention provide methods for data processing. Such methods include receiving an LDPC codeword, and grouping active bits from the LDPC codeword into a series of data bits including one or more user data bits including and at least one LDPC parity bit. The series of data bits satisfies an LDPC parity equation. In some instances of the aforementioned embodiments, the methods further include transferring the series of data bits; determining whether to prune one or more trellis data paths based on satisfaction of a parity equation corresponding to the series of data bits; and performing a data detection algorithm on the series of data bits using the trellis data paths. In particular instances, the data detection algorithm is a Viterbi algorithm.

In some instances of the aforementioned embodiments, determining whether to prune the one or more trellis data paths includes determining the number of errors remaining in the series of consecutive bits. In such instances, the data detection is performed without pruning the one or more trellis data paths when the number of errors remaining exceeds a threshold value. In other instances of the aforementioned embodiments, determining whether to prune the one or more trellis data paths includes determining the number of prior detection/decoding iterations that have been performed. In such instances, the data detection is performed without pruning the one or more trellis data paths when the number of prior detection/decoding iterations are less than a threshold value. In yet other instances of the aforementioned embodiments, determining whether to prune the one or more trellis data paths includes always determining to prune the one or more trellis data paths.

Yet other embodiments of the present invention provide methods for data processing. The methods include receiving a grouped data set that includes active bits of an LDPC codeword grouped together into a series of consecutive bits including at least one LDPC parity bit. The series of consecutive bits when correct satisfy a parity equation. The methods further include performing a data detection algorithm on the series of consecutive bits. The detection algorithm includes pruning one or more trellis data paths based on satisfaction of a parity equation. In some instances of the aforementioned embodiments, performing the data detection algorithm yields a detected output. Such methods further include ungrouping the detected output such that an LDPC codeword is recreated using the detected output.

In various instances of the aforementioned embodiments, the methods further include providing the LDPC codeword to an LDPC decoder, and decoding the LDPC codeword to yield a data output. In some such cases, the series of consecutive bits is a first series of consecutive bits, and the method further includes determining that the data output failed to converge, and re-grouping the data output to form the active bits of the LDPC codeword modified by the LDPC decoder into a second series of consecutive bits including at least one LDPC parity bit. The series of consecutive bits when correct satisfy the parity equation. In some cases, the methods further include performing the data detection algorithm on the second series of consecutive bits. In such cases, the detection algorithm includes pruning one or more trellis data paths based on satisfaction of the parity equation.

In various instances of the aforementioned embodiments, the methods further include determining whether to prune the one or more trellis data paths, where the data detection is performed without pruning the one or more trellis data paths when it is determined not to prune the one or more trellis data paths. In some such instances, determining whether to prune the one or more trellis data paths includes determining the number of errors remaining in the series of consecutive bits. In such instances, the data detection is performed without pruning the one or more trellis data paths when the number of errors remaining exceeds a threshold value. The threshold value may be programmable. In other instances, determining whether to prune the one or more trellis data paths includes determining the number of prior detection/decoding iterations that have been performed. In such instances, the data detection is performed without pruning the one or more trellis data paths when the number of prior detection/decoding iterations is less than a threshold value. In some such cases, the threshold value is programmable.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more specifically to systems and methods for detecting and/or decoding data sets.

Figure 1:
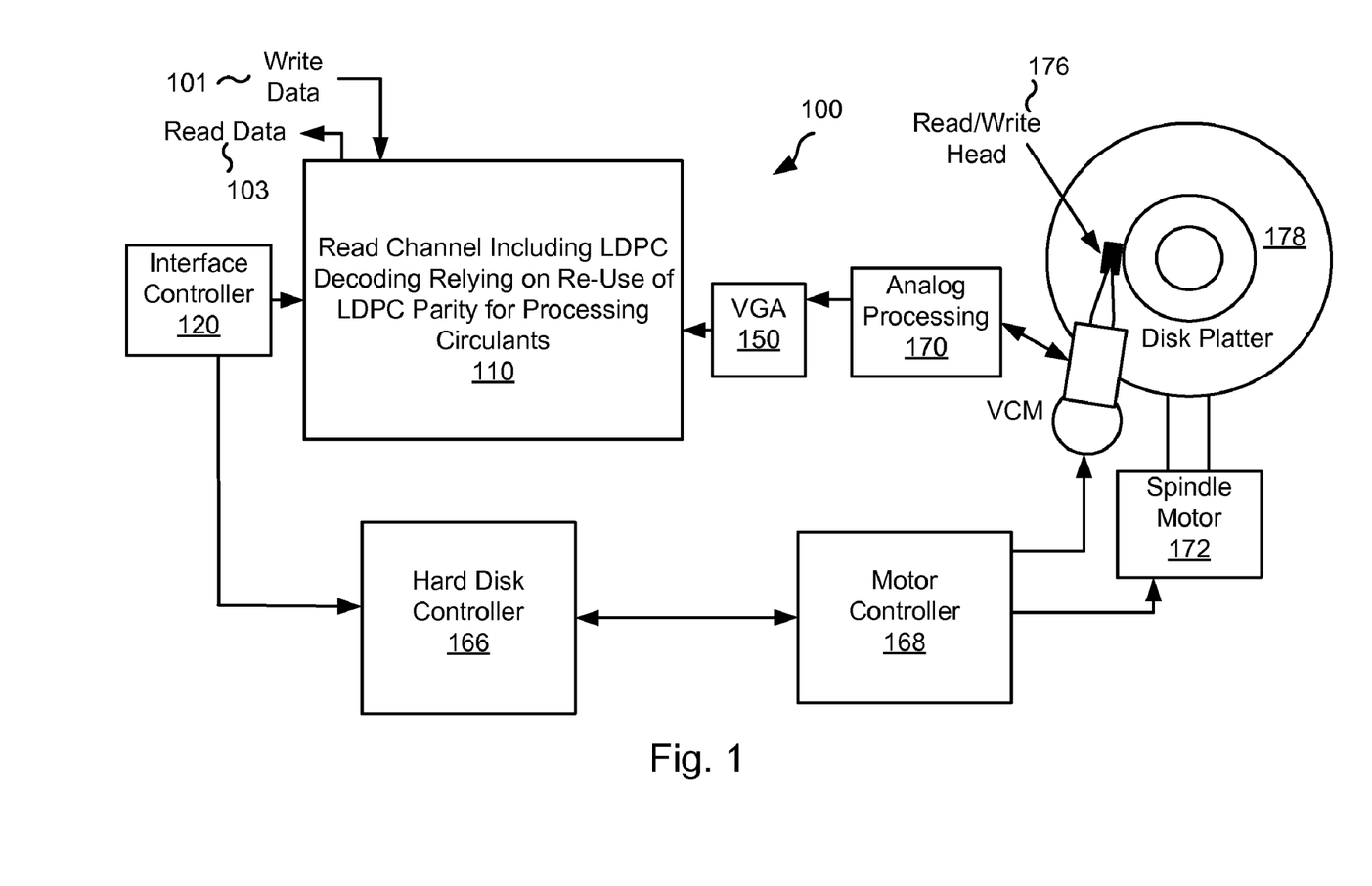
FIG. 1 shows a storage system including a read channel module relying on re-used decoder parity for data detection processes in accordance with one or more embodiments of the present invention.

Turning to FIG. 1, a storage system 100 including read channel circuit 110 relying on re-used decoder parity in a data detector circuit is shown in accordance various embodiments of the present invention. Storage system 100 may be, for example, a hard disk drive system. Examples of re-used decoder parity are discussed below in relation to FIGS. 2-5. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

As discussed above, various embodiments of the present invention re-use decoder parity in the data detection process. Where the data detector circuit expects the parity to be included in a continuous data series, various decoder parity may be rearranged into continuous data sets for use in a downstream data detector circuit. The parity provided to the data detector circuit may be used, for example, to prune the trellis of a Viterbi algorithm detector as is known in the art. Such trellis pruning limits the number of possible paths that may be selected by the decoder circuit. This increases the efficiency of the detector circuit, along with decreasing the likelihood of selecting an improper path. As just some examples, trellis pruning is discussed in U.S. Pat. No. 7,092,462 entitled "Asynchronous servo RRO detection employing interpolation"; U.S. Pat. No. 7,502,427 entitled "Asynchronous servo RRO detection employing interpolation"; U.S. Pat. No. 7,500,228 entitled "System and method for automatically generating a hierarchical register consolidation structure"; U.S. Pat. No. 6,912,099 entitled "Maximum likelihood detection of asynchronous servo data employing interpolation"; U.S. Pat. No. 6,751,774 entitled "Rate (M/N) code encoder, detector, and decoder for control data"; and US Pat. Publication No. 20060140311 entitled "Composite data detector and a method for detecting data" and filed Dec. 23, 2004 by Jonathan Ashley et al. Each of the aforementioned patents is incorporated herein by references for all purposes.

Figure 2:
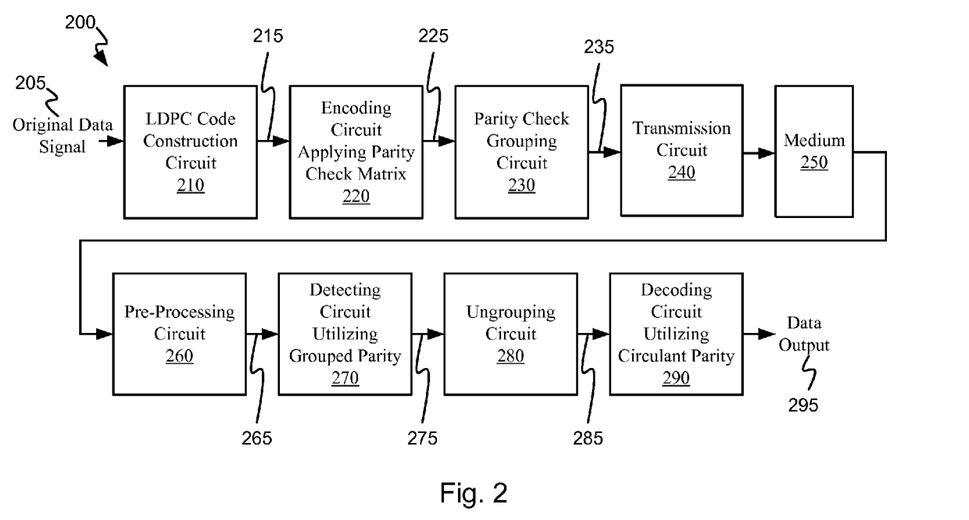
FIG. 2 is a block diagram of a data processing system including decoder parity re-use in accordance with various embodiments of the present invention.

Turning to FIG. 2, a block diagram of a data processing system 200 including decoder parity re-use is shown in accordance with various embodiments of the present invention. Data processing system 200 includes a low density parity check (LDPC) code construction circuit 210 that receives an original data signal 205. Original data signal 205 may be, but is not limited to, a set of digital data that may be received either in parallel or in serial from a data source (not shown). Based upon the disclosure provided herein, one of ordinary skill in the art will recognize a variety of data sources from which original data signal 205 may be received and/or a variety of formats for original data signal 205. LDPC code construction circuit 210 augments original data signal 205 with LDPC parity bits as is known in the art to yield a completed data set 215.

Completed data set 215 is provided to an encoding circuit 220 that applies a parity check matrix. In particular, encoding circuit 220 multiplies completed data set 215 by a pre-defined G-matrix as is known in the art to yield an LDPC codeword 225. LDPC codeword 225 includes the LDPC parity bits along with the user data assembled into parity check equations comprising non-continuous data.

As used herein, a "codeword" is a set of data that has been encoded in preparation for transfer to, for example, a data receiver or a storage medium. A codeword typically includes a large number of user data bits augmented by one or more error checking bits (e.g., parity bits), with the user data bits and error checking bits being encoded together. In some cases, the codeword is designed for use in relation to a low density parity check encoding/decoding system. In such cases, the codeword may be generated by multiplying the user data bits augmented with the error checking bits by a G-matrix as is known in the art. The G-matrix may be of a size N×M, resulting in a codeword of the same dimensions. In the decoding process, the resulting codeword is multiplied by an H-matrix which is the inverse of the G-matrix and results in recovery of the user data bits augmented by the one or more error checking bits.

The parity check equations of LDPC codeword 225 that rely on the LDPC parity check bits cannot be used by a data detector circuit as the data detector circuit requires continuous groups of bits. To re-use the LDPC parity check bits in a detector circuit, LDPC codeword 225 is provided to a parity check grouping circuit 230 that is responsible for re-ordering bits in codeword 225 such that the LDPC parity check bits can be re-used by a downstream data detector circuit. In particular, a parity equation forming part of LDPC codeword 225 may include a number of user data bits and LDPC parity bits separated by a number of intervening '0s'. The number '0s' between each of the bits varies depending upon the predefined G-matrix used to create LDPC codeword 225. Parity check grouping circuit 230 assembles the user bits and LDPC parity bits into a single continuous series of bits by removing the intervening '0s'. This process yields a grouped data set 235.

As an example, for a 4×36×72 LDPC codeword, each parity check equation connects thirty-six bits. In such a case, segments of thirty-six bits can be grouped by parity check grouping circuit 230 such that each continuous set of thirty-six bits for a parity check of the LDPC codeword. A downstream detector circuit can rely on these sets of thirty-six continuous bits as a single parity code that may be used to perform trellis pruning.

Grouped data set 235 is provided to a transmission circuit 240 that is responsible for transferring the grouped data set via a medium 250. In the case of a hard disk drive application, medium 250 may be a magnetic storage medium, and transmission circuit 240 may include a read/write head assembly disposed in relation to the magnetic storage medium. In the case of a data transmission system, medium 250 may be a wireless transmission medium, and transmission circuit 240 may be a radio frequency transmitter. Based upon the disclosure provided herein, one of ordinary skill in the art will recognize a variety of transmission circuits that may be used in relation to different embodiments of the present invention. Further, based upon the disclosure provided herein, one of ordinary skill in the art will recognize a variety of applications beyond wireless transmission and hard disk drives to which different embodiments of the present invention may be applied.

The data received from medium 250 is provided to a pre-processing circuit 260. In the example of a hard disk drive, the data received from medium 250 is received by accessing the magnetic storage medium. In the example of a wireless transmission system, the data received from medium 250 is received as RF signals. Pre-processing circuit 260 includes circuitry designed to process the received signal into a series of digital data samples 265. Digital data samples 265 represent the transferred data set, and are provided to a data detection circuit 270 that utilizes the grouped parity.

Data detection circuit 270 uses the parity check equations incorporated in grouped data sets 235 to determine trellis paths that are not likely, and accordingly removes such data paths from consideration. A data detection process is then performed on the remaining viable trellis paths to provide a most likely result. This process yields a detected output 275 that is provided to an ungrouping circuit 280. Ungrouping circuit 280 operates to reverse the grouping process performed by parity check grouping circuit 230. In particular, ungrouping circuit 280 re-creates LDPC codeword 225 using data available from data detection circuit 270 by replacing the intervening '0s' that were removed in the grouping process. Ultimately, ungrouping circuit 280 provides an ungrouped data set 285 to a decoding circuit 290.

Decoding circuit 290 performs a decoding algorithm on ungrouped data set 285 to regenerate original data signal 205. The decoding algorithm may be an LDPC decoding algorithm known in the art that multiples ungrouped data set 285 by an H-matrix which is the inverse of the G-matrix used in the encoding process. This process utilizes parity equations relying on the LDPC parity check bits to identify and correct various errors. In some cases, errors are introduced to the completed data set during the transmission process. As such, there is a difference between LDPC codeword 225 originally prepared by encoding circuit 220, and data output 295. Where the errors are corrected (i.e., all of the parity check equations succeed), the process is said to converge. Where the process does not converge, it is possible to perform another detection/decoding iteration using information generated in the first detection/decoding iteration to enhance the possibility of convergence.

It should be noted that different variations of the aforementioned system and process may be used. For example, use of the grouped parity equations (i.e., parity equations in grouped data sets 235) allows for reducing the number of potential trellis paths that may be selected in the data detection process (i.e., trellis pruning). Such trellis pruning at times may result in the improper elimination of viable trellis paths. This "mis-pruning" of the trellis can be caused where there is a large number of multiple error bits associated with re-used parity bits. To reduce the possibility of mis-pruning, an iterative solution may be employed where trellis pruning is allowed only in the second or later iterations through the detection and decoding processes. The first detection and decoding process corrects a number of errors such that the possibility of mis-pruning is reduced. After this, trellis pruning during the detection process is allowed. It should be noted that a fixed number of detection/decoding iterations (e.g., one, two or more iterations) may be performed before trellis pruning is done. Alternatively, trellis pruning may be allowed only after an error threshold is first achieved. For example, an error threshold may be tested after completion of each detection/decoding iteration to determine whether the error level is sufficiently low to allow for trellis pruning. Based upon the disclosure provided herein, one of ordinary skill in the art will recognize a variety of basis upon which the trellis pruning is turned on or off.

As just some advantages of the present invention, additional parity equations are made available for use in the detection process. By re-using the parity check bits included in the LDPC code used by the decoder (i.e., decoder parity bits), the additional parity check equations are achievable without adding additional parity check bits. This provides for additional error detection and correction capability without negatively impacting user bit density of the transferred data. In some cases, the LDPC error floor may also be reduced. In various cases, error propagation may be reduced, and detector circuit performance may be improved along with any turbo equalization performance.

Figure 3:
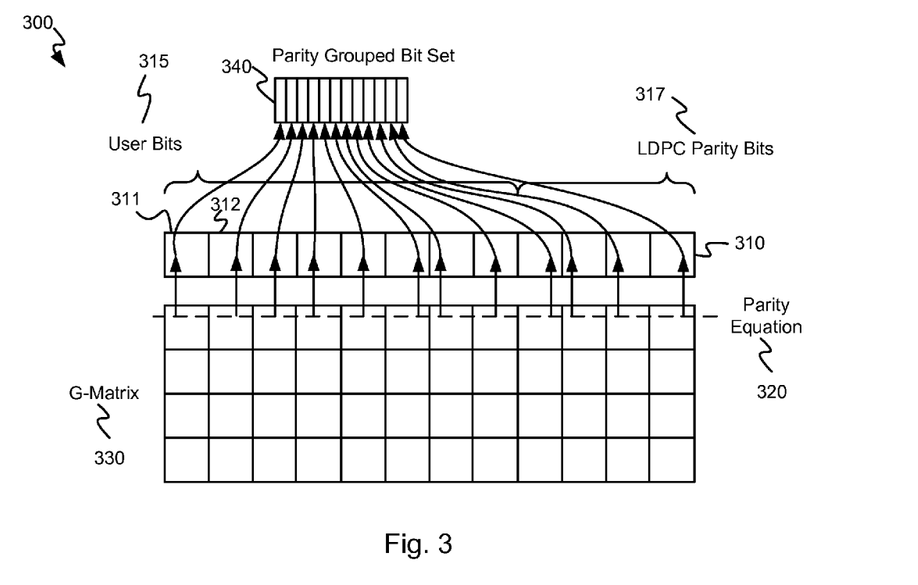
FIG. 3 graphically depicts data grouping to re-use decoder parity in relation to detection processes in accordance with one or more embodiments of the present invention.

Turning to FIG. 3, a graphic diagram 300 depicts data grouping to re-use decoder parity in relation to detection processes in accordance with one or more embodiments of the present invention. Graphic diagram 300 shows an LDPC codeword 310 including a number of user bits 315 augmented with a number of LDPC parity bits 317. The bits of LDPC codeword 310 represent a completed data set after matrix multiplication by a G-matrix 330. The multiplication causes the bits of the completed data set to be separated by a varying number of '0s', and for a combination of all '1s' in LDPC codeword 310 to correspond to a particular parity equation 320 in G-matrix 330. Thus, for example, the first bit of the completed data set may be placed a number of bit positions after the beginning of LDPC codeword 310, and another number of bit positions before the end of a circulant 311 in which the bit is incorporated through the process of multiplication by G-matrix 330. The next bit of the completed data set may be placed a different number of bit positions from the beginning of another circulant 312, and a yet different number of bits from the end of circulant 312. Each of the other circulants are similarly created. The other bits in the circulants are '0s'.

The grouping process operates to select the bits derived from the completed data set (i.e., the bits represented by arrows in graphic diagram 300) and to group them together into a grouped data set 340. Each bit in grouped data set 340 may be either a '1' or a '0'. Grouped data set 340 is LDPC codeword 310 with the intervening '0s' (i.e., all bits other than those represented as arrows) removed. This grouped data set includes all of the active bits (i.e., bits that can be either a '1' or '0' depending upon the received user data) of parity equation 320 included in a continuous series of data bits.

Turning to FIG. 4, a flow diagram 400 depicts a method in accordance with some embodiments of the present invention for re-using decoder parity in relation to data detection processes. Following flow diagram 400, a data input is received (block 405). The data input may be received from any data source, and may be received in any format. In an exemplary embodiment, the data input is received sixty-four bits at a time from a processor. Based upon the disclosure provided herein, one of ordinary skill in the art will recognize a variety of sources from which the data input may be drawn. Further, one of ordinary skill in the art will recognize a variety of formats in which the data may be received.

Figure 4A:
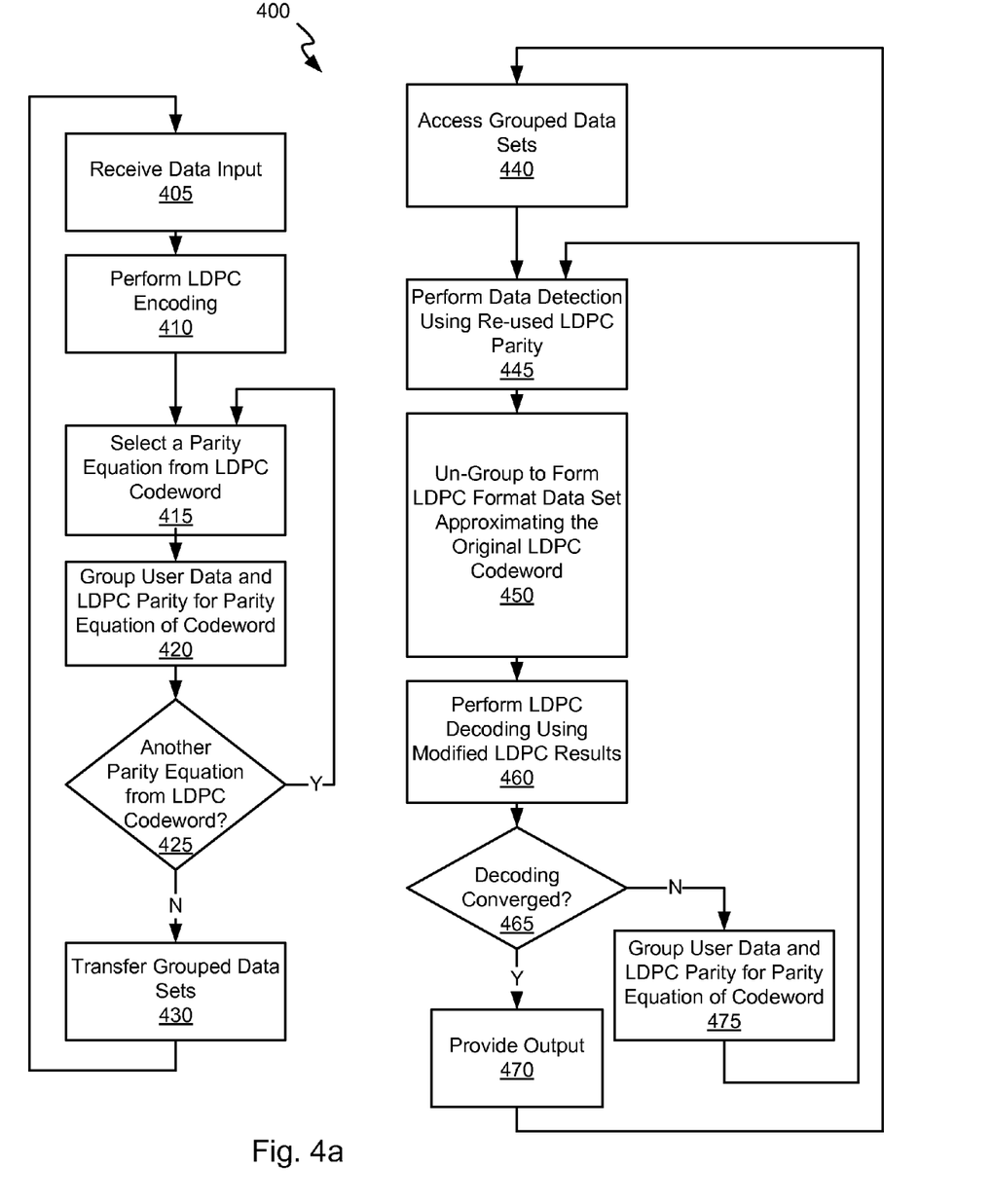
FIG. 4a is a flow diagram depicting a method in accordance with some embodiments of the present invention for re-using decoder parity in relation to data detection processes.

The data input is encoded in accordance with an LDPC encoding process (block 410). This may include, for example, adding a number of LDPC parity bits to the received data input. Thus, for example, a number of user data bits are selected and a group of LDPC parity bits are added to create a completed data set as is known in the art. A number of the completed data sets are then multiplied by a G-matrix to yield LDPC codewords. Individual parity equations from the created LDPC codewords are respectively selected that correspond to a particular codeword (block 415). The user data and LDPC parity bits in the LDPC codeword (i.e., the active bits or bits that are changeable depending upon the received user data) are separated from the intervening '0s' to yield grouped data sets (block 420).

It is then determined whether another parity equation remains in the LDPC codeword (block 425). Where additional parity equations remain (block 425), the processes of blocks 415-425 are repeated for another LDPC codeword. Alternatively, where no additional parity equations remain (block 425) the grouped data sets are transferred (block 430).

Such a transfer is performed in different ways depending upon the system in which the method is being performed. For example, in a hard disk drive system, the transfer includes writing the low density parity check codeword to a magnetic storage medium. As another example, in a wireless transmission system, the transfer includes transmitting the low density parity check codeword via RF signals. Based upon the disclosure provided herein, one of ordinary skill in the art will recognize a variety of transfers of the low density parity check codeword that may be done in accordance with different embodiments of the present invention.

The grouped data sets are accessed (block 440). Access of the grouped data sets mirrors the aforementioned transfer. For example, where the transfer is via a storage medium, access is done by retrieving data from the storage medium. Data detection using the re-used LDPC parity is performed (block 445). In particular, the parity may be used to prune the trellis to allow for more efficient and/or accurate data detection. This data detection may be done using algorithms that are known in the art. For example, in some embodiments of the present invention, a Viterbi algorithm data detection process may be used.

The result of the data detection process is ungrouped to yield the original format of the LDPC codeword only augmented with the data resulting from the data detection process (block 455). LDPC decoding is performed on the ungrouped data (block 460). It is then determined whether the output converged (block 465). Where the output converged (block 465), the output is provided (block 470). Alternatively, where the output failed to converge (block 465), the result of the LDPC decoding is grouped to re-use the LDPC parity bits (block 475), and the processes of blocks 440-465 are repeated.

Figure 4B:
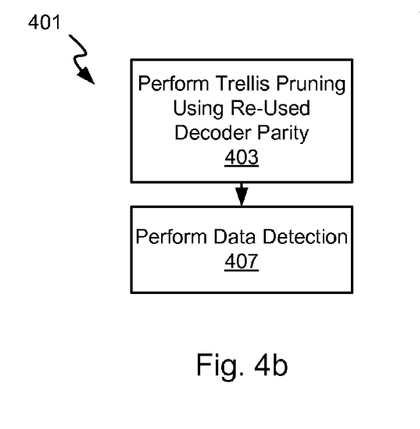
FIGS. 4b-4d are flow diagrams showing different approaches for performing data detection using re-used LDPC parity in accordance with different embodiments of the present invention.
Figure 4C:
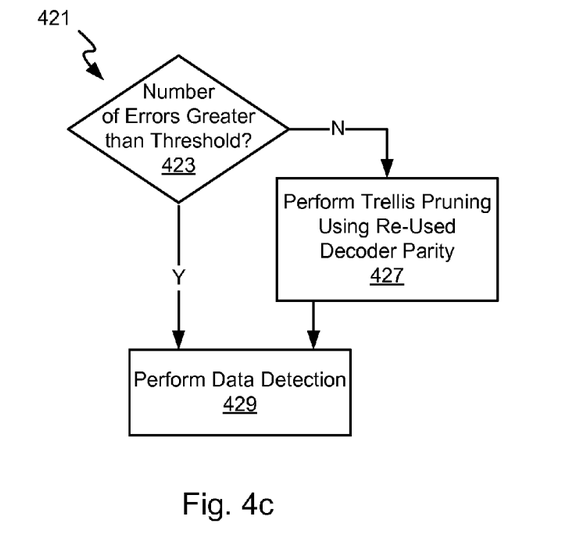
Figure 4D:
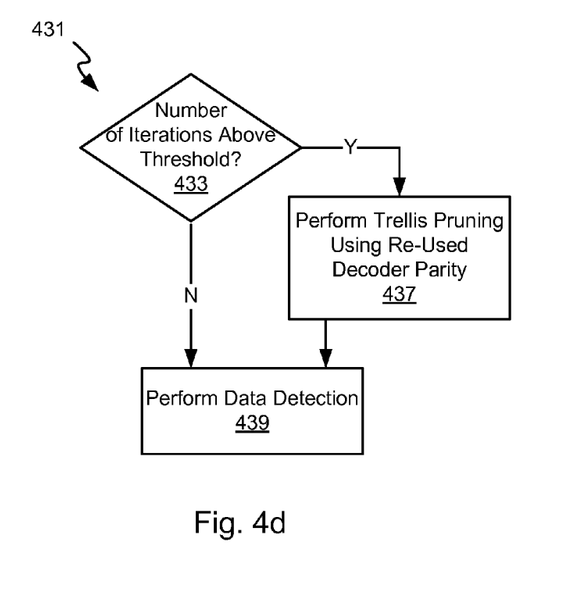

FIGS. 4b-4d are flow diagrams showing different approaches for performing data detection using re-used LDPC parity in accordance with different embodiments of the present invention. In particular, any of the processes depicted in FIGS. 4b-4d may be used in place of block 445 of FIG. 4a. Turning to FIG. 4b, a data detection process involving trellis pruning for each iteration is depicted as a flow diagram 401 in accordance with some embodiments of the present invention. Following flow diagram 401, the re-used decoder parity is used to determine which paths of a trellis diagram are less likely based on failure to satisfy the parity equations (block 403). Such a process makes the detection process more efficient. The detection process is then performed using the pruned trellis diagram (block 407). Turning to FIG. 4c, a data detection process involving trellis pruning only when an error threshold is met is depicted as a flow diagram 421 in accordance with some embodiments of the present invention. Following flow diagram 421, it is determined a number of errors remaining and whether the number of errors exceeds a threshold level (block 423). This may be done by determining how many of the parity equations relying on re-used decoder parity exhibit multiple errors. Where the number of errors exceeds the threshold (block 423), data detection is performed (block 429) without first performing trellis pruning. Alternatively, where the number of errors is below a threshold value (block 423), trellis pruning is performed (block 427). Such a process makes the detection process more efficient. The detection process is then performed using the pruned trellis diagram (block 429). Turning to FIG. 4d, a data detection process involving trellis pruning only when an error threshold is met is depicted as a flow diagram 431 in accordance with some embodiments of the present invention. Following flow diagram 431, it is determined a number of errors remaining and whether the number of errors exceeds a threshold level (block 433). This may be done by determining how many detection and decoding iterations have been previously performed. Where the number of iterations is less than a threshold (block 433), data detection is performed (block 439) without first performing trellis pruning. Alternatively, where the number of iterations exceeds a threshold value (block 433), trellis pruning is performed (block 437). Such a process makes the detection process more efficient. The detection process is then performed using the pruned trellis diagram (block 439).

Figure 5:
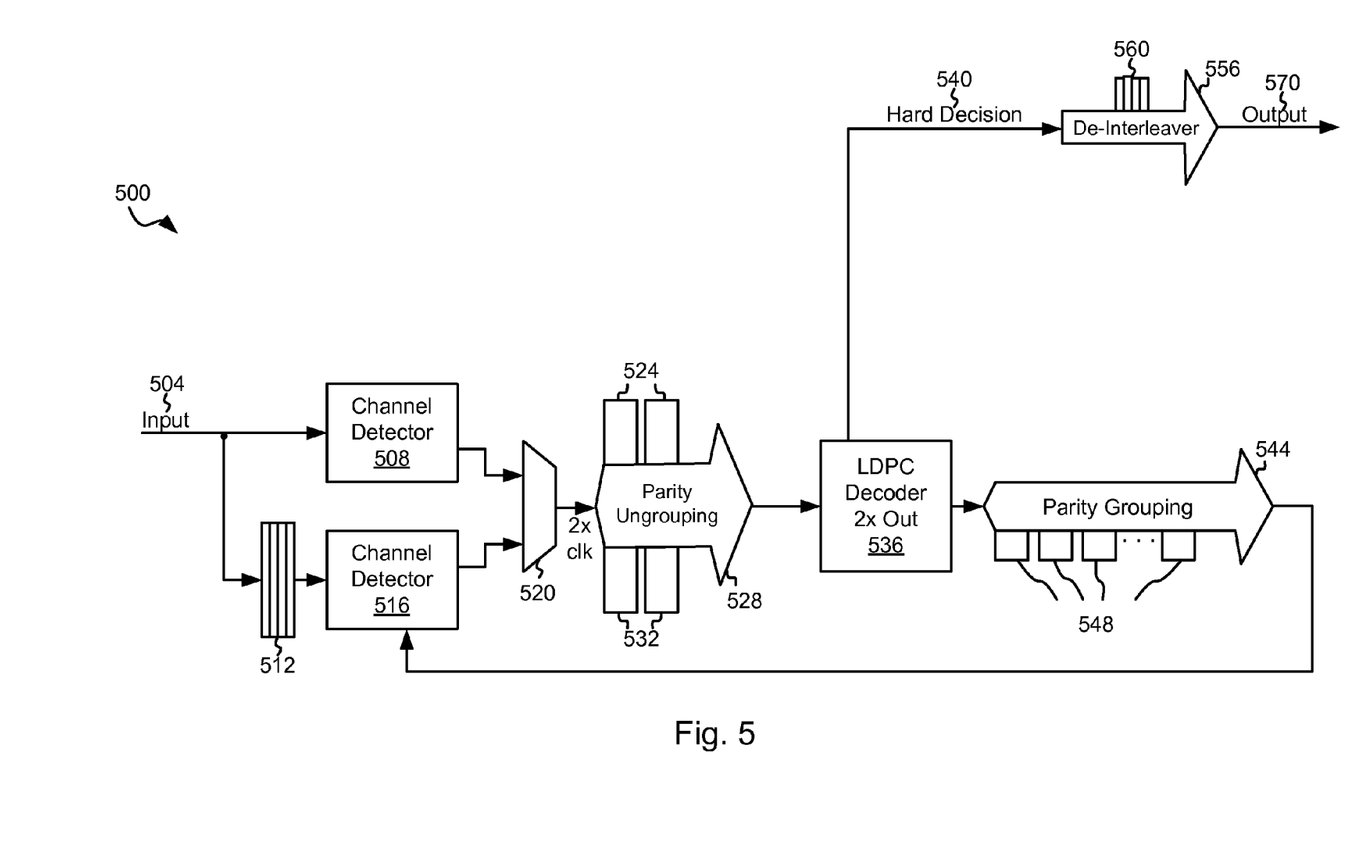
FIG. 5 shows a particular data processing system showing grouping and ungrouping operable to assemble parity enhanced data sets re-using decoder parity in relation to data detection processes in accordance with various embodiments of the present invention.

Turning to FIG. 5, a particular data processing system 500 is shown including groping circuits and ungrouping circuits operable to assemble parity enhanced data sets re-using decoder parity in relation to data detection processes in accordance with various embodiments of the present invention. Data processing system 500 includes a data input 504 that is fed to a channel detector 508. Data input 504 was grouped to re-use decoder parity prior to transfer to data processing system 500. This parity grouping was graphically depicted in relation to FIG. 3 above. Channel detector 508 may be any type of channel detector known in the art including, but not limited to, a soft output Viterbi algorithm detector (SOVA) or a maximum a posteriori (MAP) detector. Channel detector 508 uses the decoder parity grouped in data input to prune the detection trellis using approaches known in the art. Based on the disclosure provided herein, one of ordinary skill in the art will recognize a variety of channel detectors that may be used in accordance with different embodiments of the present invention. In addition, data input 504 is provided to an input data buffer 512 that is designed to hold a number of data sets received from data input 504. The size of input data buffer 512 may be selected to provide sufficient buffering such that a data set input via data input 504 remains available at least until a first iteration processing of that same data set is complete and the processed data is available in a queue buffer 548 (i.e., a queuing buffer) as more fully described below. Input data buffer 512 provides the data sets to a channel detector 516. Similar to channel detector 508, channel detector 516 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 508 and channel detector 516 are provided to a parity ungrouping circuit 528 via a multiplexer 520. Such outputs may be, for example, log likelihood ratio values. Parity ungrouping circuit 528 undoes the parity grouping (i.e., performs the reverse process as that described above in relation to FIG. 3) that was originally applied to data input 504 such that the data is returned to the format used by the decoder. Parity ungrouping circuit 528 separately ungroups the output of channel detector 508 and separately ungroups the output of channel detector 516 using two ping pong buffers 524, 532. One of the buffers in ping pong buffer 524 holds the result of a prior ungrouping process of the output from channel detector 508 and is unloaded to an LDPC decoder 536, while the other buffer of ping pong buffer 524 holds a data set from channel detector 508 that is currently ungrouped. Similarly, one of the buffers in ping pong buffer 532 holds the result of a prior parity ungrouping process of the output from channel detector 516 and is unloaded to LDPC decoder 536, while the other buffer of ping pong buffer 524 holds a data set from channel detector 516 that is currently being ungrouped. It should be noted that other soft decision data decoders may be used in place of LDPC decoder 536 in different embodiments of the present invention.

LDPC decoder 536 is capable of decoding one or more data sets simultaneously. As an example, LDPC decoder 536 may be designed to decode an ungrouped data set from ping pong buffer 524, or an ungrouped data set from ping pong buffer 532, or to decode data sets from ping pong buffer 524 and ping pong buffer 532 simultaneously. The decoded data is either provided as a hard decision output 540 or to a parity grouping circuit 544 that uses queue buffer 548 to group the decoded data and to store the grouped data until channel detector 516 is available for further processing. The grouping is performed similar to that discussed above in relation to FIG. 3.

One of the buffers in queue buffer 548 holds the result of a prior grouping process and is unloaded to channel detector 516, while another buffer of queue buffer 548 holds a decoded data set currently being grouped, and one or more other buffers in queue buffer 548 maintain other non-converged data waiting for processing by channel detector 516. Non-converged data from queue buffer 548 is passed to channel detector 416 that has access to the corresponding data set in memory buffer 512. The data detection performed by channel detector 516 is similar to that performed by channel detector 508. Hard decision output 540 are provided to a de-interleaver circuit 556 that de-interleaves the received hard decision output 540 and stores the de-interleaved result in one of a number of memory buffers 560. Ultimately, de-interleaver circuit 556 provides the de-interleaved data stored in memory buffers 560 as an output 570.

In operation, a first data set is introduced via data input 504 to channel detector 508. Channel detector 508 performs its channel detection algorithm and provides both a hard output and a soft output to multiplexer 520. The hard and soft decision data is written to one buffer of ping pong buffer 524. At the same time the detector output is written into the buffer, parity ungrouping circuit 528 may ungroup the data set by writing consecutive data into non-consecutive memory/buffer addresses based on the ungrouping algorithm/mapping. Once parity ungrouping circuit 528 completes its ungrouping process, the ungrouped data is decoded by LDPC decoder 536. Where the data converges, LDPC decoder 536 writes its output as hard decision output 540 to output data buffer 560 and the processing is completed for that particular data set. Alternatively, where the data does not converge, LDPC decoder 536 writes its output (both soft and hard) to queue buffer 548. The scheduling guarantees that there is at least one empty buffer for holding this new set of data, and this strategy assures that each data input is guaranteed the possibility of at least two global iterations (i.e., two passes through a detector and decoder pair).

The data is provided from queue buffer 548 to channel detector 516. Channel detector 416 selects the data set that corresponds to the output in queue buffer 548 from input data buffer 512 and performs a subsequent data detection aided by the soft output data generated by LDPC decoder 536 fed back from queue buffer 548, and the re-used decoder parity. By using the previously generated soft data for data maintained in input data buffer 512 and the re-used decoder parity, channel detector 516 generally performs a subsequent channel detection with heightened accuracy. The output of this subsequent channel detection is passed to parity ungrouping circuit 528 via multiplexer 520. The data is written to one buffer of ping pong buffer 532, and parity ungrouping circuit 528 ungroups the data. The ungrouped data is then passed to LDPC decoder 536 where it is decoded a second time. Similar to the first iteration, a decision is made as to whether the data converged or whether there is insufficient space in queue buffer 548 to handle the data. Where such is the case, LDPC decoder 536 writes its output as hard decision output 540 to output data buffer 560 and the processing is complete for that particular data set. Alternatively, where the data does not converge and there is sufficient buffer space in queue buffer 548 to receive an additional data set, writes its output (both soft and hard) to queue buffer 548 where it is passed back to channel detector 516 for a third pass. Sufficient space is defined in queue buffer 548 by having at least reserved space for the data set from the first detector and decoder after the data set from the second detector and decoder is written into the ping pong buffer.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   a data detection circuit, wherein the data detection circuit includes pruning one or more trellis data paths based upon satisfaction of a parity equation including active bits grouped from an LDPC codeword, and wherein the active bits include at least one LDPC parity bit;
   an ungrouping circuit, wherein the ungrouping circuit is operable to create an LDPC format data set; and
   a decoding circuit, wherein the decoding circuit performs an LDPC decoding algorithm on the LDPC format data set.

2. The system of claim 1, wherein the data detection circuit performs a soft output Viterbi algorithm data detection.

3. The system of claim 1, wherein the LDPC codeword is a transferred LDPC codeword, and wherein the system further comprises:
   a grouping circuit, wherein the grouping circuit receives a pre-transfer LDPC codeword, and wherein the grouping circuit assembles the active bits corresponding to a parity check equation of the pre-transferred LDPC codeword to yield a grouped data set.

4. The system of claim 3, wherein the system further comprises:
   a transmission circuit, wherein the transmission circuit transmits the grouped data set.

5. A method for data processing, the method comprising:
   receiving an LDPC codeword; and
   grouping active bits from the LDPC codeword into a series of data bits including one or more user data bits including and at least one LDPC parity bit, and wherein the series of data bits satisfies an LDPC parity equation.

6. The method of claim 5, wherein the method further comprises:
   transferring the series of data bits;
   determining whether to prune one or more trellis data paths based on satisfaction of a parity equation corresponding to the series of data bits; and
   performing a data detection algorithm on the series of data bits using the trellis data paths.

7. The method of claim 6, wherein the data detection algorithm is a soft output Viterbi algorithm.

8. The method of claim 6, wherein determining whether to prune the one or more trellis data paths includes:
   determining the number of errors remaining in the series of consecutive bits; and
   wherein the data detection is performed without pruning the one or more trellis data paths when the number of errors remaining exceeds a threshold value.

9. The method of claim 6, wherein determining whether to prune the one or more trellis data paths includes:
   determining the number of prior detection/decoding iterations that have been performed; and
   wherein the data detection is performed without pruning the one or more trellis data paths when the number of prior detection/decoding iterations are less than a threshold value.

10. The method of claim 6, wherein determining whether to prune the one or more trellis data paths includes always determining to prune the one or more trellis data paths.

11. A method for data processing, the method comprising:
    receiving a grouped data set, wherein the grouped data set includes active bits of an LDPC codeword grouped together into a series of consecutive bits including at least one LDPC parity bit, and wherein the series of consecutive bits when correct satisfy a parity equation; and
    performing a data detection algorithm on the series of consecutive bits, wherein the detection algorithm includes pruning one or more trellis data paths based on satisfaction of a parity equation.

12. The method of claim 11, wherein performing the data detection algorithm yields a detected output, and wherein the method further comprises:
    ungrouping the detected output, wherein an LDPC format data set created using the detected output.

13. The method of claim 12, wherein the method further comprises:
    providing the LDPC format data set to an LDPC decoder;
    decoding the LDPC format data set to yield a data output.

14. The method of claim 13, wherein the series of consecutive bits is a first series of consecutive bits, and wherein the method further comprises:
    determining that the data output failed to converge; and
    re-grouping the data output to form the active bits of the LDPC format data set modified by the LDPC decoder into a second series of consecutive bits including at least one LDPC parity bit, and wherein the series of consecutive bits when correct satisfy the parity equation.

15. The method of claim 14, performing the data detection algorithm on the second series of consecutive bits, wherein the detection algorithm includes pruning one or more trellis data paths based on satisfaction of the parity equation.

16. The method of claim 11, wherein the method further comprises:
    determining whether to prune the one or more trellis data paths, wherein the data detection is performed without pruning the one or more trellis data paths when it is determined not to prune the one or more trellis data paths.

17. The method of claim 16, wherein determining whether to prune the one or more trellis data paths includes:
    determining the number of errors remaining in the series of consecutive bits; and
    wherein the data detection is performed without pruning the one or more trellis data paths when the number of errors remaining exceeds a threshold value.

18. The method of claim 17, wherein the threshold value is programmable.

19. The method of claim 16, wherein determining whether to prune the one or more trellis data paths includes:
    determining the number of prior detection/decoding iterations that have been performed; and wherein the data detection is performed without pruning the one or more trellis data paths when the number of prior detection/decoding iterations is less than a threshold value.

20. The method of claim 19, wherein the threshold value is programmable.

* * * * *